United States Patent [19]

Blanz

[11] Patent Number: 5,530,353

[45] Date of Patent: Jun. 25, 1996

[54] VARIABLE TEMPERATURE NMR PROBE

[75] Inventor: Martin Blanz, Oxon, United Kingdom

[73] Assignee: Oxford Analytical Instruments Limited, Oxford, United Kingdom

[21] Appl. No.: 350,973

[22] Filed: Nov. 29, 1994

[30] Foreign Application Priority Data

Nov. 30, 1993 [GB] United Kingdom .................. 9324596

[51] Int. Cl.$^6$ ..................................................... G01V 3/00
[52] U.S. Cl. ........................................... 324/315; 324/321
[58] Field of Search .................................... 324/315, 316, 324/317, 318, 322, 307, 309, 321

[56] References Cited

U.S. PATENT DOCUMENTS 5,015,954  5/1991  Dechene et al. ........................ 324/307

OTHER PUBLICATIONS

*Journal of Physicse Scientific–Instruments*, vol. 12, No. 7, A High–Temperature Furnace for NMR Measurements, F. X. Soller, S. Sotier, H. Coufal and K. Hackstein, 1979, pp. 577–579.

*Journal of Magnetic Resonance*, No. 1, Design and Operation of a Variable High–Temperature Oxygen Partial–Pressure Probe Device for Solid–Statte NMR, H. Lolem, O. Kanert, and H. Schulz, 1990, pp. 160–165.

*Journal of Physicse Scientific–instruments*, A Pulsed Nuclear Magnetic Resonance Probe Using a Water Thermostat, V. S. Steckline, K. F. Kuhlmann and W. S. Magee, 1971, pp. 122–123 .

*Instruments and Experimental Techniques*, No. 2, Part 2, S. I. Selivanov, R. A. Bogatkin and B. A. Ershov, 1983, pp. 401–403.

*Journal of Magnetic Resonance*, Magic–Angle Spinning NMR at Near–Liquid–Helium Temperatures, No. 1, A. Hackmann, H. Seidel, R. D. Kendrick, P. C. Myhre and C. S. Yannoni, 1987, pp. 148–153.

"A high–temperature and high–field MR instrument" by D. Ploumbidis Rev. Sci. Instrum. 50(9) Sep. 1979 pp. 1133–1135.

*Primary Examiner*—Louis M. Arana

[57] ABSTRACT

A variable temperature NMR probe having a RF coil surrounding a sample position and a fluid jacket for conveying fluid to control the temperature at the sample position. An RF electromagnetic shield prevents fluid in a fluid conveyor from affecting a NMR signal from the sample position.

18 Claims, 2 Drawing Sheets

# VARIABLE TEMPERATURE NMR PROBE

FIELD OF THE INVENTION

This invention relates to a variable temperature nuclear magnetic resonance (NMR) probe.

DESCRIPTION OF THE PRIOR ART

In pulsed NMR, the sample resides in a radio frequency (RF) coil of which the magnetic field axis is perpendicular to a constant external magnetic field which may be generated by a permanent magnet as in the QP20 manufactured by Oxford Instruments Limited, or by other means. The sample is irradiated by a radio frequency magnetic field pulse via the RF coil. This causes the magnetisation of the sample to precess around the external magnetic field with a frequency which is specific for each kind of nucleus (and proportional to the external magnetic field). After the applied pulse has finished the still precessing magnetisation of the sample induces a radio frequency voltage in the RF coil which is detected and which is the useful signal. For proton NMR all materials used in the neighbourhood of the RF coil should be proton free as otherwise the proton signal of these materials will overlay the signal of the sample. In addition, electrically conductive materials in the neighbourhood of the RF coil should only be used with care and avoided where possible as they disturb the RF field by eddy currents and reduce the quality factor of the coil. Preferred materials for coil formers and sample tubes for proton NMR are therefore: glass, ceramic, and the two proton free plastics polytetrafluoroethene (Teflon) and polychlorotrifluoroethene (Kel-F).

There is a need to provide a variable temperature (VT) NMR probe comprising a radio frequency coil, and means for cooling/heating a sample within the coil to enable NMR measurements to be performed at desired sample temperatures. A known probe which achieves this has a liquid jacket which surrounds the RF coil and the sample. The problem with this kind of VT probe is the fact that proton free liquids need to be used to prevent a proton NMR signal originating from the liquid. These are in general perfluorinated/chlorinated hydrocarbons which have the disadvantages of being expensive, having a small specific heat capacity and evaporating quickly if the whole system cannot be hermetically sealed. In addition, those liquids should be avoided due to their impact on the environment.

SUMMARY OF THE INVENTION

In accordance with the present invention, a variable temperature NMR probe comprises a RF coil surrounding a sample position; and fluid conveying means for conveying fluid to control the temperature at the sample position and is characterised in that the probe further comprises a RF electro-magnetic shield preventing fluid in the fluid conveying means from affecting a NMR signal from the sample position.

The invention avoids the problems outlined above by providing a radio frequency electro-magnetic shield and thus enables the use of cheap and thermodynamically more favourable proton containing liquids like water or oil.

The invention can be used in pulsed NMR and continuous wave NMR experiments.

Typically, the electro-magnetic shield is completely non-ferromagnetic which enables the probe to be used with an external magnetic field although it may contain ferromagnetic material as part of the shims to achieve a homogeneous field at the sample position.

In one example, the shield comprises an array of circumferentially spaced elements positioned around the coil, the elements being thermally conducting and in thermal communication with the fluid conveying means.

In another example, the shield is in the form of one or more tubes through which fluid is conveyed, the or each tube being positioned so that the fluid within the tube(s) influences the temperature at the sample position. In one case, an array of circumferentially spaced, fluid conveying tubes is positioned around the RF coil, the wall of each tube defining part of the RF electro-magnetic shield.

In a further example, the shield comprises a tube surrounding the RF coil.

Typically, the fluid conveying means will comprise a jacket surrounding the RF coil which gives the user the ability to store samples in a thermally stabilised bath of the circulating liquid.

Conveniently, the electro-magnetic shield forms a wall of the fluid jacket. In one case, for example, the outer wall of the fluid jacket comprises a radially outer tube spaced from the electro-magnetic shield with the jacket defined between them.

Where the electro-magnetic shield surrounds the RF coil it may take a variety of forms and shapes but conveniently is tubular and has an axial length greater than the axial length of the RF coil. This prevents the RF coil together with the shield becoming a transformer with the RF coil being the primary winding and the shield being the short circuited secondary winding. Preferably, the axes of the coil and shield are substantially coincident.

The space between the RF coil and the shield is preferably filled, in the case where proton NMR is to be performed, with a proton free electrical isolator which also preferably has a high thermal conductivity. A suitable material is ceramic. For other types of NMR, different types of material would be suitable.

In practice, the distance between the coil and the shield is a compromise. While the coil performs better if the distance is large, the heat transfer between liquid and sample and therefore the thermal stability of the latter is increased if the distance is small. Other effects which must be taken into account are the usually high peak voltage of several thousand volts between coil and shield and the capacitive coupling between coil and shield. Both effects call for a gap between coil and shield of at least 1 mm, preferably 2 mm or 3 mm. However, there is an unusual kind of probe, known in the literature as "Delay Line Probe" (I J Lowe and M Engelsberg, Rev Sci Instrum, vol 45, 631–639, and I J Lowe and D W Whitson, Rev Sci Instrum, vol 48, 268–274), which can make use of the capacitive coupling between the RF coil and the shield.

The shield material can be of any convenient type, for example brass, stainless steel or copper. Where pulsed gradient fields are used in the NMR experiment, then a material with a higher resistivity than copper is desirable to reduce the effect of eddy currents.

Typically, the RF coil is mounted on a glass or ceramic former in a conventional manner.

Although the apparatus is defined as a "probe", it should be understood that this does not mean that it is necessarily removable from the surrounding apparatus.

BRIEF DESCRIPTION OF THE DRAWINGS

Some examples of variable temperature NMR probes according to the invention will now be described with reference to the accompanying drawings, in which.

DETAILED DESCRIPTION OF THE EMBODIMENTS

Figure 1A:
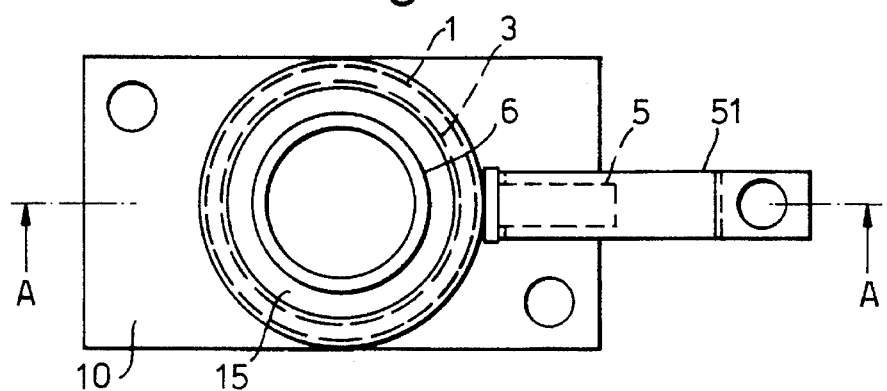
FIGS. 1A and 1B are a plan and section on the line A—A respectively of a first example.
Figure 1B:
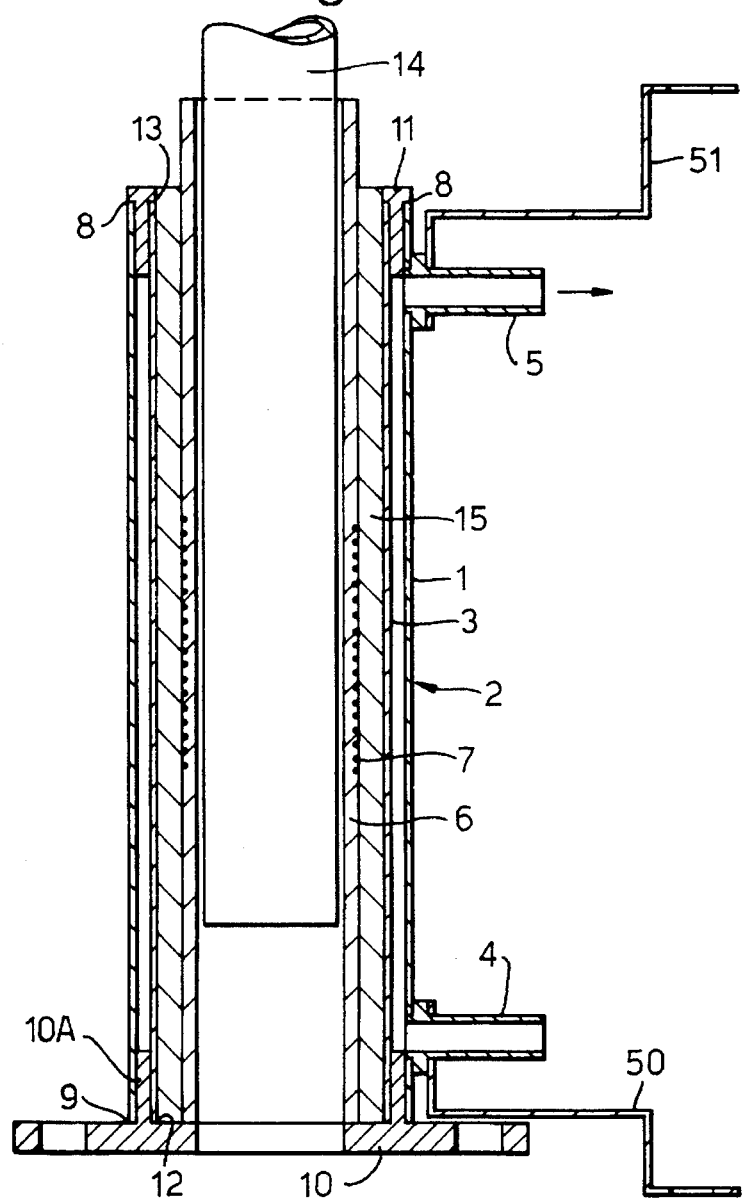

The probe shown in FIGS. 1A and 1B comprises an outer stainless steel tube 1 having a thickness of 0.25 mm defining the outer wall of a water jacket 2. The inner wall of the water jacket 2 is defined by an inner, stainless steel tube 3 having a wall thickness of about 0.25 mm which additionally defines an electro-magnetic shield. Water is pumped into the water jacket 2 via an inlet port 4 and exits through an exit port 5. Earth straps 50,51 are connected to the ports 4,5. The outer tube 1 is welded at 9,8 to a lower plate 10 and an upper ring 11 respectively while a skirt 10A of the plate 10 and the ring 11 are welded at 12,13 respectively to the inner tube 3.

Coaxial with the tube 3 is a ceramic tube 6 which constitutes a former around which an RF coil 7 is wound (see FIG. 1B). The space between the RF coil 7 and the shield 3 is filled by a proton free electrical isolator with fairly high thermal conductivity, namely ceramic 15.

The overall dimensions of the probe shown in FIG. 1 are a height of about 74 mm, an outside diameter of about 20 mm and an inside diameter of about 10.5 mm. The former 6 typically has an outer diameter of about 12.5 mm and protrudes above the water jacket 2 by about 6 mm.

In use, a sample is positioned inside the tube 6 as shown at 14. Water is circulated through the water jacket at a temperature which is externally controlled so that the sample at the sample position takes up a desired temperature and a NMR experiment is then performed. It will be understood that the probe shown in FIGS. 1A and 1B is mounted in a surrounding NMR test unit which incorporates a magnet for generating a steady magnetic field at the sample position which causes protons in the sample to precess. The unit also includes processing circuitry for controlling operation of the RF coil 7 and processing signals received by the RF coil during the experiment. As mentioned earlier, a suitable unit is the QP20 manufactured by Oxford Instruments Limited.

The probe shown in FIGS. 1A and 1B has been built and it was found gave a 30% reduction in RF field (compared to the use of an RF coil without the shield and jacket) but at a temperature gradient of less than 0.1° C. over the RF coil length. It will be noted that by using the RF screen 3 as the inner wall of the water jacket 2, the best possible heat transfer and smallest overall size is achieved. This is particularly useful where limited space is available within the main magnet.

Figure 2A:
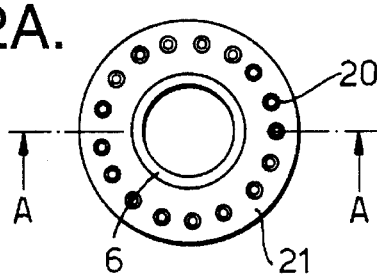
FIGS. 2A and 2B are a plan and section on the line A—A in FIG. 2A respectively of a second example; and, FIGS. 3A and 3B are a side elevation and section of the line A—A in FIG. 3A respectively of a third example.
Figure 2B:
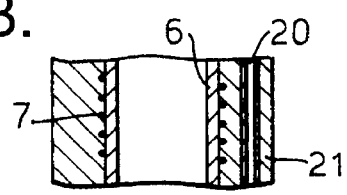

In the example shown in FIGS. 2A and 2B, the water jacket 2 is replaced by an array of metal tubes 20 circumferentially spaced around the RF coil 7 and a glass former 6. Once again, ceramic 21 is provided in which the metal tubes are embedded. The metal tubes 20 are electrically isolated from one another and this design would greatly reduce the eddy current problem while still being thermally efficient and shielding the RF from the liquid in the pipes 20.

Figure 3A:
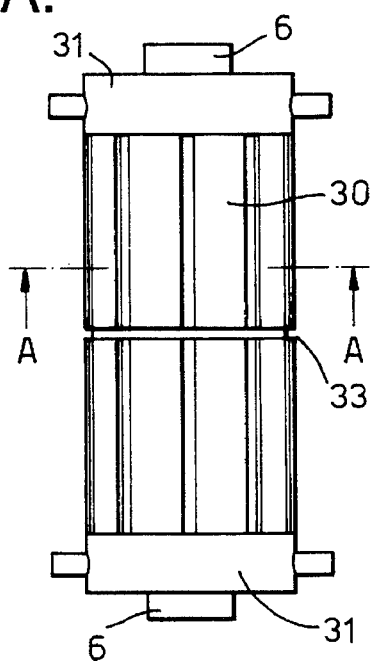
Figure 3B:
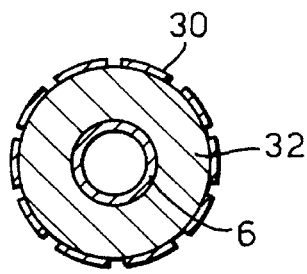

FIGS. 3A and 3B illustrates a further example. In this case, the stainless steel tube shield 3 of FIGS. 1A and 1B is replaced by a set of elongate, copper fins 30 circumferentially spaced around the RF coil and former 6. The water jacket is replaced by a pair of water vessels 31 at each end of the copper fins 30 which are filled with water at different temperatures to define a temperature gradient therebetween which causes heat to be conducted along the fins, that heat being conveyed through a ceramic member 32 to the tube 6 and sample. This design again greatly reduces eddy currents compared to the solid cylindrical shield shown in FIGS. 1A and 1B. A circular gap 33 is provided in the centre of the fins 30 to cut large eddy current loops as the fins may be electrically connected at both ends.

I claim:

1. A variable temperature proton NMR probe comprising a RF coil surrounding a sample position; fluid conveying means for conveying fluid to control the temperature at the sample position; and a RF electro-magnetic shield preventing fluid in said fluid conveying means from affecting a proton NMR signal from the sample position.

2. A probe according to claim 1, wherein said RF electro-magnetic shield comprises an array of circumferentially spaced elements positioned around said RF coil, the elements being thermally conducting and in thermal communication with said fluid conveying means.

3. A probe according to claim 1, wherein said RF electro-magnetic shield comprises a tube surrounding said RF coil.

4. A probe according to claim 1, wherein said fluid conveying means comprises a fluid jacket surrounding said RF coil.

5. A probe according to claim 1, wherein said RF electro-magnetic shield forms part of said fluid conveying means.

6. A probe according to claim 4, wherein said RF electro-magnetic shield forms part of said fluid jacket.

7. A probe according to claim 6, wherein said RF electro-magnetic shield defines a wall of said fluid jacket.

8. A probe according to claim 7, wherein said RF electro-magnetic shield defines an inner wall of said fluid jacket.

9. A probe according to claim 1, wherein said RF electro-magnetic shield is in the form of at least one tube defining the fluid conveying means and through which fluid is conveyed, said at least one tube being positioned so that the fluid within said tube influences the temperature at said sample position.

10. A probe according to claim 1, wherein said RF electro-magnetic shield is in the form of a plurality of tubes defining the fluid conveying means and through which fluid is conveyed, said tubes being arranged in a circumferentially spaced array around said RF cell.

11. A probe according to claim 1, wherein said RF coil and said RF electro-magnetic shield define a space therebetween which is filled with a proton free electrically isolating material.

12. A probe according to claim 11, wherein said proton free electrically isolating material is ceramic.

13. A probe according to claim 1, wherein said RF electro-magnetic shield is spaced from said RF coil by at least 1 mm.

14. A probe according to claim 13, wherein said RF electro-magnetic shield is spaced from said RF coil by at least 2 mm.

15. A probe according to claim 14, wherein said RF electro-magnetic shield is spaced from said RF coil by at least 3 mm.

16. A probe according to claim 1, wherein said RF electro-magnetic shield is made of a non-ferromagnetic material.

17. A probe according to claim 16, wherein said RF electro-magnetic shield is made of one of brass, stainless steel and copper.

18. A method of performing a proton NMR experiment, the method comprising:

positioning a sample at a sample position of a NMR probe including a RF coil surrounding the sample position, fluid conveying means for conveying fluid to control the temperature at said sample position, and a RF electro-magnetic shield preventing fluid in said fluid conveying means from affecting a proton NMR signal from said sample position;

subjecting the sample to a steady magnetic field;

operating the RF coil to generate suitable pulse signals; and monitoring signals received by the RF coil.

* * * * *